United States Patent
Zheng et al.

(10) Patent No.: US 9,768,587 B1
(45) Date of Patent: Sep. 19, 2017

(54) SCALABLE FAST TUNABLE SI-ASSISTED HYBRID LASER WITH REDUNDANCY

(71) Applicant: Oracle International Corporation, Redwood Shores, CA (US)

(72) Inventors: Xuezhe Zheng, San Diego, CA (US); Jin Yao, San Diego, CA (US); Ying Luo, San Diego, CA (US); Ashok V. Krishnamoorthy, San Diego, CA (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 0 days.

(21) Appl. No.: 15/341,691

(22) Filed: Nov. 2, 2016

(51) Int. Cl.
*H01S 5/00* (2006.01)
*H01S 5/10* (2006.01)
*H01S 5/125* (2006.01)
*H01S 5/30* (2006.01)
*H01S 5/50* (2006.01)
*H01S 5/14* (2006.01)
*H01S 5/06* (2006.01)
*H01S 5/187* (2006.01)

(52) U.S. Cl.
CPC .......... *H01S 5/1092* (2013.01); *H01S 5/0608* (2013.01); *H01S 5/1028* (2013.01); *H01S 5/125* (2013.01); *H01S 5/141* (2013.01); *H01S 5/187* (2013.01); *H01S 5/3013* (2013.01); *H01S 5/5027* (2013.01)

(58) Field of Classification Search
CPC ...... H01S 5/141; H01S 5/1092; H01S 5/0608; H01S 5/0268; H01S 5/187; H01S 5/5027
See application file for complete search history.

(56) References Cited

U.S. PATENT DOCUMENTS

| | | | |
|---|---|---|---|
| 9,362,711 B2 * | 6/2016 | Coleman | H01S 3/10053 |
| 2004/0160994 A1 * | 8/2004 | Zhang | H01S 3/06754 372/23 |
| 2005/0123300 A1 * | 6/2005 | Kim | H04J 14/0226 398/84 |

(Continued)

OTHER PUBLICATIONS

Bell Laboratories, Lucent Technology; "Electronics Letters", Jul. 20, 2000, vol. 36 No. 15; pp. 1294-1296.

(Continued)

*Primary Examiner* — Kinam Park
(74) *Attorney, Agent, or Firm* — Park, Vaughan, Fleming & Dowler LLP

(57) ABSTRACT

The disclosed embodiments provide a tunable laser that includes a set of M reflective silicon optical amplifiers (RSOAs) and a set of N narrow-band reflectors. It also includes a silicon-photonic optical switch, having M amplifier ports, which are coupled through a set of M optical waveguides to the set of M RSOAs, and N reflector ports, which are coupled to the set of N narrow-band reflectors. The tunable laser also includes a switching mechanism that facilitates coupling at least one selected amplifier port from the M amplifier ports with a selected reflector port from the N reflector ports, thereby causing an RSOA coupled to the selected amplifier port to form a lasing cavity with a narrow-band reflector coupled to the selected reflector port. The tunable laser also includes a laser output, which is optically coupled to the lasing cavity.

20 Claims, 12 Drawing Sheets

(56) References Cited

U.S. PATENT DOCUMENTS

2013/0016423 A1* 1/2013 Zheng .................... H01S 5/142
359/344
2013/0163993 A1* 6/2013 Choi .................... H04B 10/572
398/79

OTHER PUBLICATIONS

Zheng et al; "Three-Dimensional MEMS Photonic Cross-Connect Switch Design and Performance" IEEE Journal of Selected Topics in Quantum Electronics, vol. 9, No. 2, Mar./Apr. 2003, 1077-260X/03$17.00, 2003 IEEE.

Lee et al.; "Demonstration of 12.2% wall plug efficiency in uncooled single mode external-cavity tunable Si/III-V hybrid laser", #231407—$15.00 USD, Received Dec. 26, 2014; revised Mar. 30, 2015; accepted Apr. 8, 2015; published Apr. 29, 2015; May 4, 2015 | vol. 23, No. 9| DOI: 10.1364/OE.23.012079|Optics Express 12079.

Seok et al.; "Large-scale broadband digital silicon photonic switches with vertical adiabatic couplers"; research article optica; received Oct. 19, 2015; revised Dec. 4, 2015; accepted Dec. 7, 2015 (Doc. ID 252161); published Jan. 13, 2016; 2334-2536/16/010064-07$15/0$15.00 2016; Optical Society of America.

Seok et al.; "Highly Scalable Digital Silicon Photonic MEMS Switches"; Journal of Lightwave Technology, vol. 34, No. 2, Jan. 15, 2016; 0733-8724; 2015 IEEE.

* cited by examiner

US 9,768,587 B1

SCALABLE FAST TUNABLE SI-ASSISTED HYBRID LASER WITH REDUNDANCY

GOVERNMENT LICENSE RIGHTS

This invention was made with U.S. government support under Agreement No. HR0011-08-9-0001 awarded by DARPA. The U.S. government has certain rights in the invention.

BACKGROUND

Field

The disclosed embodiments relate to the design of a tunable laser. More specifically, the disclosed embodiments relate to the design of fast tunable hybrid laser that integrates a fast silicon micro-electromechanical systems (MEMS) optical switch with multiple III-V gain media and one or more banks of reflective silicon optical filters.

Related Art

Energy-efficient and cost-effective switches are important building blocks for communication networks in data centers and high-performance computing systems. Existing three-dimensional MEMS-based photonic switches can provide low-cost and energy-efficient traffic switching. However, the millisecond switching times of such switches limit their application to either "elephant" traffic with large packet sizes, or network reconfigurations that are not sensitive to switching time. Recently developed silicon-photonic switches can potentially provide fast optical circuit switching with microsecond, or even nanosecond response times. Moreover, relatively large-scale integrated photonic switches can be realized on silicon using MEMS-actuated matrices. However, existing silicon-photonic MEMS-based optical switches support single polarization only, making them undesirable for practical deployment in optical networks.

An alternative to the optical-switching approach is to use the unique wavelength routing capability of arrayed-waveguide-grating-routers (AWGRs) and carrier wavelength switching at the source node. However, a wavelength-tunable laser source is needed for such source-originated optical switching. A wavelength-tunable hybrid laser source has been implemented using back-end-of-the-line (BOEL) hybrid integration of a III-V gain chip with a silicon-on-insulator (SOI) photonic chip with a tunable wavelength selective reflector. (See Jin-Hyoung Lee, Jock Bovington, Ivan Shubin, Ying Luo, Jin Yao, Shiyun Lin, John E. Cunningham, Kannan Raj, Ashok V. Krishnamoorthy and Xuezhe Zheng, "Demonstration of 12.2% wall plug efficiency in uncooled single mode external-cavity tunable Si/III-V hybrid laser," Optics Express, 23(9) 12079-12088, 2015.) Unfortunately, the wavelength tuning speed of this type of silicon-assisted hybrid laser is limited by the response time of the silicon thermal tuner, which is usually on the order of a few microseconds.

Hence, to achieve the goal of sub-microsecond optical switching, faster tunable lasers are needed.

SUMMARY

The disclosed embodiments provide a tunable laser that includes a set of M reflective silicon optical amplifiers (RSOAs) and a set of N narrow-band reflectors. It also includes a silicon-photonic optical switch, having M amplifier ports, which are coupled through a set of M optical waveguides to the set of M RSOAs, and N reflector ports, which are coupled to the set of N narrow-band reflectors. The tunable laser also includes a switching mechanism that facilitates coupling at least one selected amplifier port from the M amplifier ports with a selected reflector port from the N reflector ports, thereby causing a RSOA coupled to the selected amplifier port to form a lasing cavity with a narrow-band reflector coupled to the selected reflector port. This lasing cavity has a wavelength, which is determined by a center wavelength of the narrow-band reflector. The tunable laser also includes a laser output, which is optically coupled to the lasing cavity.

In some embodiments, the set of N narrow-band reflectors is a subset of a larger set of M×N narrow-band reflectors, wherein the larger set of M×N narrow-band reflectors is divided into M subsets that each contain N narrow-band reflectors. Moreover, the silicon-photonic optical switch includes M 1×N switching cells and an M×1 output switching cell. Each of the M 1×N switching cells attaches a given RSOA in the set of M RSOAs with an associated subset of N narrow-band reflectors, whereby the given RSOA can be selectively coupled to a selected narrow-band reflector in the associated subset of N narrow-band reflectors to form a lasing cavity. The tunable laser further comprises M directional couplers, which are integrated into the set of M optical waveguides to produce M outputs that feed into the M×1 output switching cell, which selects one of the M outputs to be the laser output.

In some embodiments, each of the M RSOAs has a different gain peak, and the subset of N narrow-band reflectors, each of which is associated with the M RSOAs, spans a wavelength band centered around a gain peak for the RSOA.

In some embodiments, each of the M RSOAs is identical, and each of the M subsets of N narrow-band reflectors is identical, thereby providing redundancy.

In some embodiments, the silicon-photonic optical switch includes an M×N switching cell and an M×1 output switching cell, wherein the M×N switching cell facilitates coupling a selected RSOA from the set of M RSOAs with a selected narrow-band reflector from the set of N narrow-band reflectors to form a lasing cavity. Moreover, the tunable laser further comprises M directional couplers, which are integrated into the set of M optical waveguides to produce M outputs that feed into the M×1 output switching cell, which selects one of the M outputs to be the laser output.

In some embodiments, the silicon-photonic optical switch includes an M×1 input switching cell, a 1×N switching cell and an M×1 output switching cell. The M×1 input switching cell selectively couples a selected RSOA in the set of M RSOAs with the 1×N switching cell, and the 1×N switching cell selectively couples the selected RSOA with a selected reflector in the set of N narrow-band reflectors to form a lasing cavity. The tunable laser further comprises M directional couplers, which are integrated into the set of M optical waveguides to produce M outputs that feed into the M×1 output switching cell, which selects one of the M outputs to be the laser output.

In some embodiments, the set of N narrow-band reflectors is implemented using one of the following: (1) a set of N distributed Bragg reflectors (DBRs); (2) a set of N ring-resonator-based filters, wherein each ring-resonator-based filter in the set has a specific radius to achieve a specific center wavelength; (3) an arrayed waveguide grating (AWG), wherein a waveguide DBR is coupled to a multiplexed output of the AWG to provide partial reflections to the lasing cavity and to simultaneously provide the laser output; and (4) an Echelle grating, wherein a waveguide DBR is coupled to a multiplexed output of the Echelle grating to provide partial reflections to the lasing cavity and to simultaneously provide the laser output.

In some embodiments, the set of M RSOAs is located on a III-V gain chip, which is separate from a silicon-on-insulator (SOI) chip that includes the silicon-photonic optical switch and other components of the tunable laser.

In some embodiments, the set of M RSOAs on the III-V gain chip are optically coupled to the set of M optical waveguides on the SOI chip through one of: waveguide-to-waveguide edge coupling; surface-normal coupling; or evanescent coupling.

In some embodiments, the tunable laser further comprises a set of M phase tuner, wherein each optical waveguide in the set of M optical waveguides feeds through a phase tuner in the set of M phase tuners before coupling to one of the M amplifier ports of the silicon-photonic optical switch, wherein the set of M phase tuner facilitates adjusting at least one frequency for the tunable laser.

In some embodiments, there exists a predetermined channel spacing between center wavelengths for the N narrow-band reflectors in the set of N narrow-band reflectors.

DETAILED DESCRIPTION

The following description is presented to enable any person skilled in the art to make and use the present embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present embodiments. Thus, the present embodiments are not limited to the embodiments shown, but are to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Tunable Laser

Figure 1:
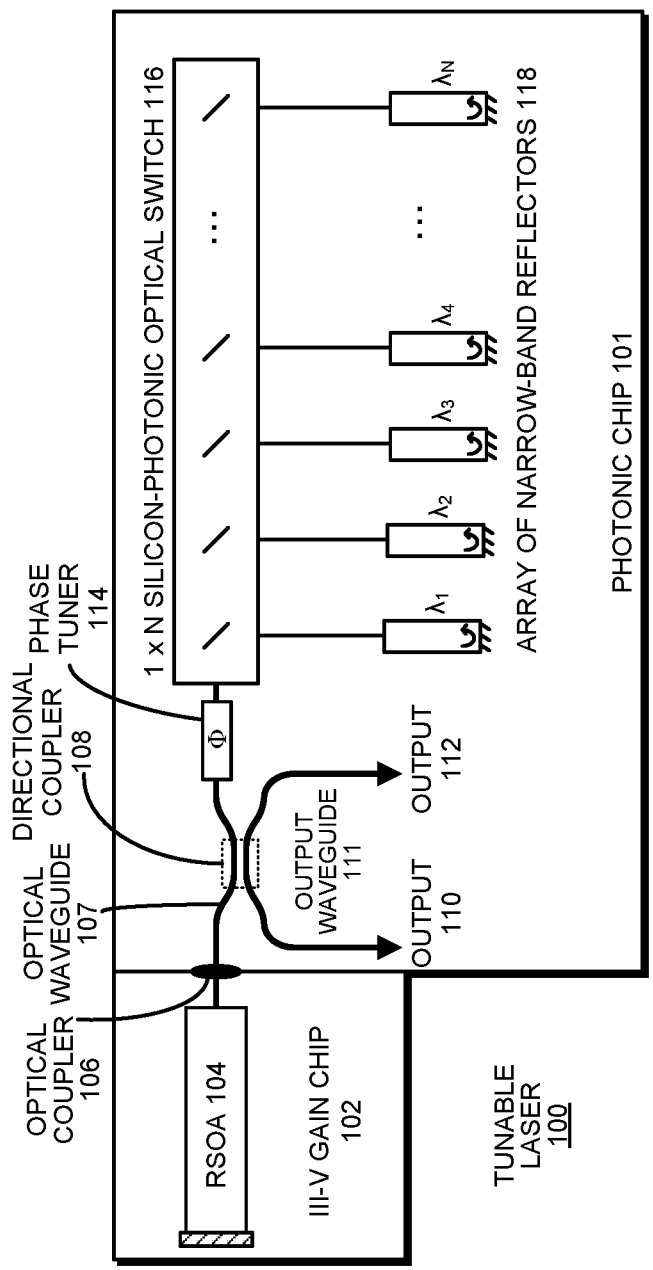
FIG. 1 illustrates a tunable laser implemented using an array of narrow-band reflectors in accordance with the disclosed embodiments.

FIG. 1 illustrates a tunable laser 100 implemented using an array of narrow-band reflectors 118 in accordance with the disclosed embodiments. This tunable laser 100 includes a reflective semiconductor optical amplifier (RSOA) 104, which comprises an optical gain medium with a reflective coating at one end. This optical gain medium may include a III-V semiconductor, such as gallium-arsenide, indium-phosphide, erbium or germanium. In some embodiments, a high reflectivity mirror is integrated into the optical gain medium instead of using the reflective coating. For example, this integrated high reflectivity mirror can include: a strong DBR, a notched mirror, or a metal layer. As illustrated in FIG. 1, RSOA 104 can be located on a MN gain chip 102, which is separate from a photonic chip 101 that includes other components of the tunable laser. Photonic chip 101 can be implemented using silicon-on-insulator (SOI) technology.

RSOA 104 generates an optical signal, which has an associated carrier or fundamental wavelength $\lambda$ (such as 1.3 or 1.55 $\mu m$). This optical signal feeds though an optical coupler 106 into an optical waveguide 107 in photonic chip 101. Optical waveguide 107 feeds the optical signal into an input port of a 1×N silicon-photonic optical switch 116, which has N output ports, wherein each of the N output ports is coupled to a different narrow-band reflector in the array of N narrow-band reflectors 118. This 1×N silicon-photonic switch 116 can be implemented using a micro-electromechanical systems (MEMS)-actuated matrix. (For an example of this type of MEMS-actuated matrix switch, see Tae Joon Seok, Niels Quack, Sanyoon Han, Richard S. Muller, and Ming C. Wu, "Large-scale broadband digital silicon photonic switches with vertical adiabatic couplers," Optica, 3 (1) 64-70 (2016). Also, see Tae Joon Seok, Niels Quack, Sanyoon Han, Richard S. Muller, and Ming C. Wu, "High scalable digital silicon photonic MEMS switches," JLT 34 (2) 365-371 (2016).) This type of MEMS-actuated matrix can be very compact and can also achieve sub-microsecond switching with very small insertion loss. Hence, fast (sub-microsecond) wavelength switching is expected with little impairment to wall-plug-efficiency when it is integrated with an external-cavity III-V/Si hybrid laser.

Figure 2:
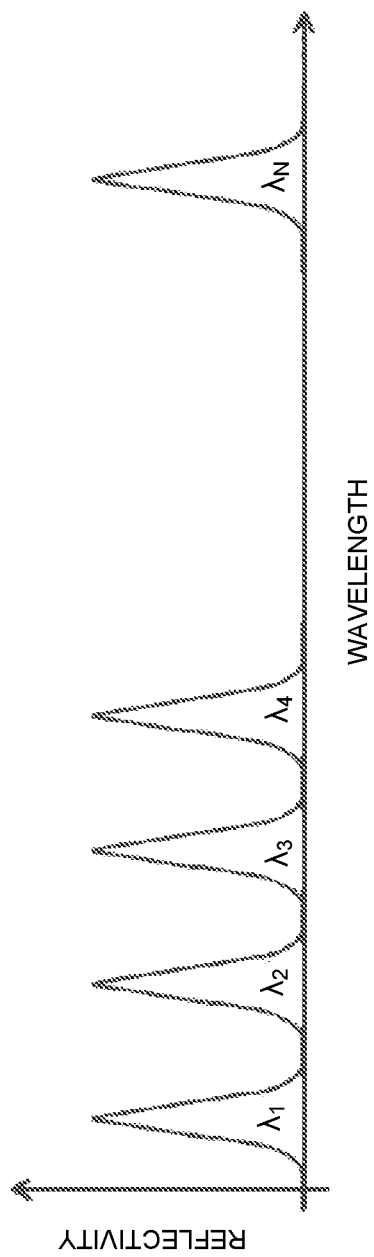
FIG. 2 illustrates the combined spectra of an array of narrow-band reflectors in accordance with the disclosed embodiments.

Moreover, each narrow-band reflector in the array of narrow-band reflectors 118 is designed to provide: a high reflectivity, a narrow bandwidth on the order of ~0.5 nm, and a different center wavelength at a pre-determined channel spacing. For example, the combined spectra of the reflector array is conceptually illustrated in FIG. 2. The filter frequencies can be selected to span the width of the gain medium. In this case, the number of filters in the array is constrained by the width of the gain medium and the inter-channel spacing between the filters.

The frequency of tunable laser 100 can be adjusted in discrete increments by selectively coupling the input port of 1×N silicon-photonic optical switch 116 to one of the N output ports, thereby causing RSOA 104 to form a lasing cavity with a selected narrow-band reflector in the array of narrow-band reflectors 118, which is coupled to the selected output port. This lasing cavity has a wavelength that is determined by the center wavelength of the selected narrow-band reflector.

Optical waveguide 107 feeds through a phase tuner 114 before feeding into the input of 1×N silicon-photonic optical switch 116, wherein phase tuner 114 facilitates fast alignments of the lasing cavity mode with the selected reflector's center wavelength. Note that phase tuner 114 can be adjusted thermally, or alternatively through p-i-n carrier injection (electro-optic effect), which is faster. Although adjusting phase tuner 114 thermally is relatively slow in comparison to p-i-n injection, the range of the phase tuner is fairly small because the cavity modes that need to be adjusted are close to the desired wavelength. Hence, adjusting phase tuner 114 thermally will not take a significant amount of time. Also note that in some embodiments, the filters are aligned with the cavity modes during manufacture as part of the calibration process, which means that phase alignments do not need to take place during switching operations. Also note that in some embodiments the phase tuner can be replaced by a passive thermo-optic coefficient compensator (TOC), which has a thermo-optic index coefficient smaller than silicon and a length selected to make the effective thermo-optic coefficient of the hybrid laser cavity equivalent to the silicon waveguides. By using this type of passive TOC, the individual filters will always be aligned with the cavity mode once they are pre-aligned during manufacture.

As illustrated in FIG. 1, tunable laser 100 also includes an output waveguide 111, which is optically coupled to optical waveguide 107 through a directional coupler 108 that is integrated into optical waveguide 107. This output waveguide 111 has two ends that function as outputs 110 and 112 for tunable laser 100. In some embodiments, the optical output signals that emanate from outputs 110 and 112 comprise optical carrier signals that feed into modulators (not shown). These modulators can modulate the optical output signals with corresponding information signals to generate modulated signals, which are communicated off-chip.

In some embodiments, optical coupler 106 connects an optical signal from RSOA 104 into optical waveguide 107 on photonic chip 101 through one of the following mechanisms: waveguide-to-waveguide edge coupling (such as facet-to-facet optical coupling); vertical or surface-normal coupling (such as a vertical-angled technique using an angled-facet output on RSOA 104, and grating couplers on photonic chip 101), and/or optical proximity communication, which may involve using reflective mirrors and/or evanescent coupling. In an exemplary embodiment, edge-to-edge coupling is facilitated by using a wide optical waveguide within RSOA 104, such as an optical waveguide having a width of 2-3 µm, wherein optical waveguide 107 on photonic chip 101 may have a width of several hundred nanometers. A spot size converter (SSC) can be used for the small optical waveguide for low-loss coupling to the RSOA optical waveguide.

Figure 3:
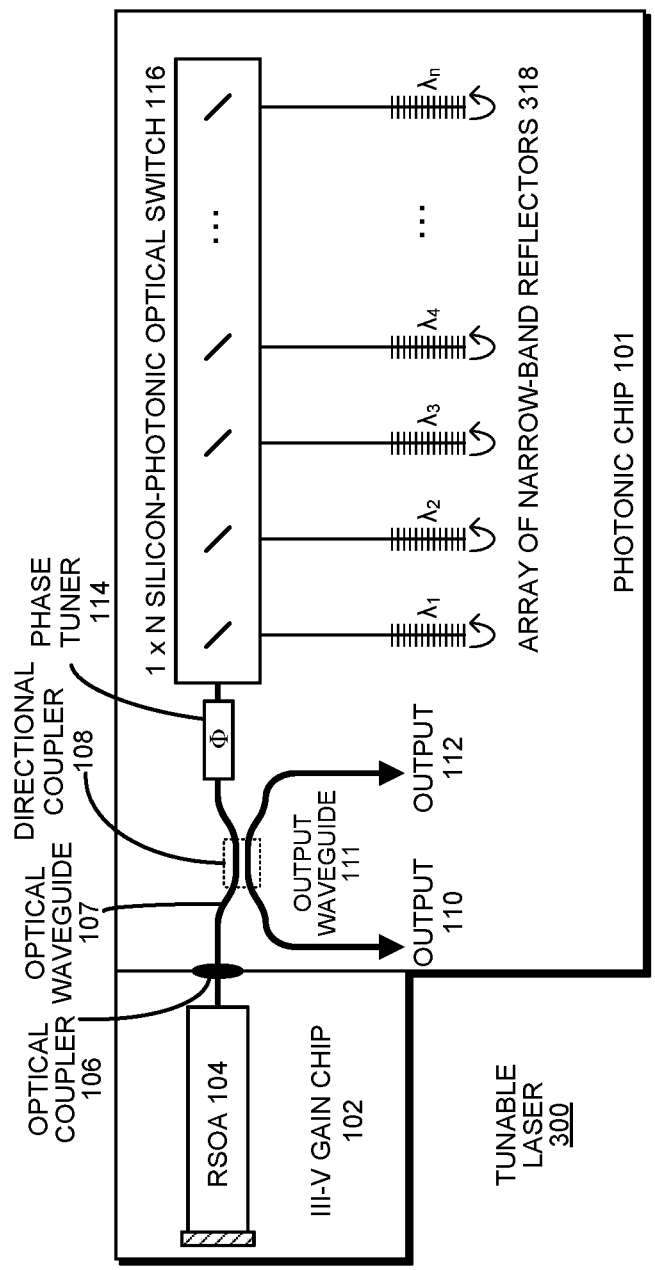
FIG. 3 illustrates a tunable laser implemented using an array of DBRs in accordance with the disclosed embodiments.

In another embodiment of a tunable laser 300, which is illustrated in FIG. 3, each narrow-band reflector in the array of narrow-band reflectors 318 is implemented using a distributed Bragg reflector (DBR) on a silicon waveguide. Note that each of these DBRs can be designed with a slightly different pitch to achieve different center wavelengths at a constant spacing.

Figure 4:
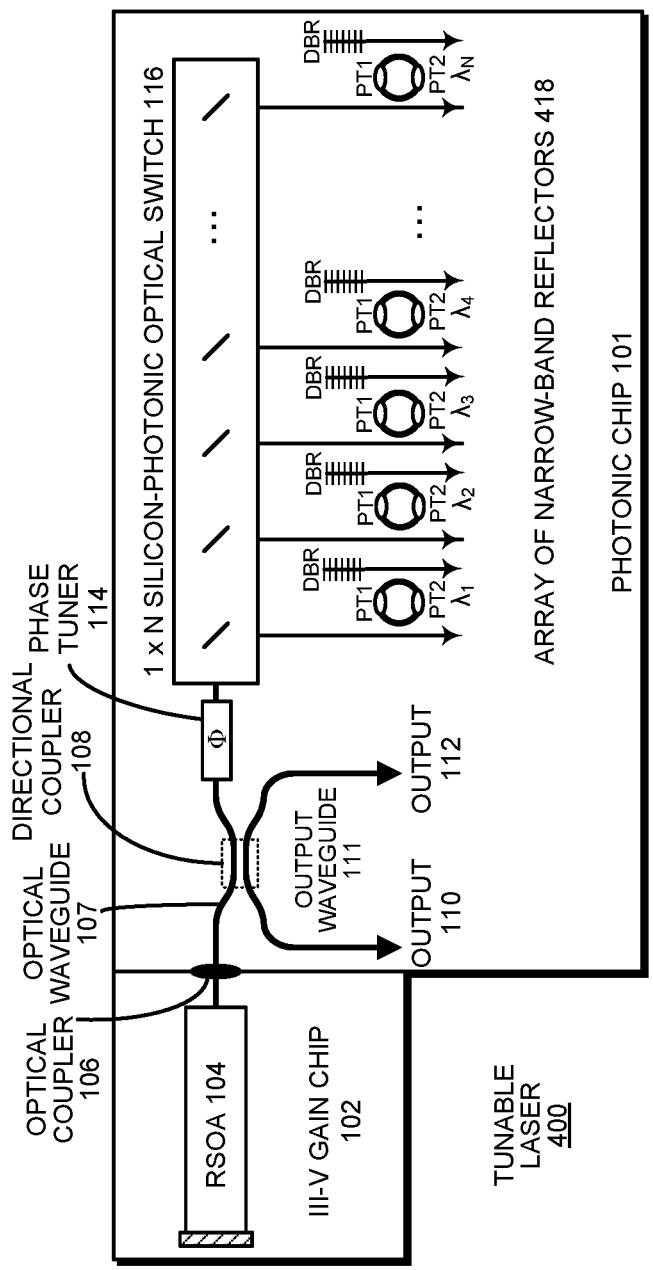
FIG. 4 illustrates a tunable laser implemented using an array of ring-resonator-based filters in accordance with the disclosed embodiments.

In another embodiment of a tunable laser 400, which is illustrated in FIG. 4, each narrow-band reflector in the array of narrow-band reflectors 418 is implemented using a silicon ring resonator and an associated waveguide DBR mirror, wherein each ring resonator is designed with a slightly different radius to achieve different center wavelengths. During operation, light from RSOA 104 is coupled to the selected ring resonator and is optically coupled to the associated waveguide DBR mirror, which reflects the light back through the ring resonator again, and finally back to RSOA 104. Moreover, the waveguide DBR mirror, which is optically coupled to each ring resonator, can be designed with a bandwidth slightly smaller than the free-spectral-range of the ring resonator filter, such that each ring resonator filter only reflects a single narrow wavelength band. Note that each ring resonator can be integrated with phase tuners, PT1 and PT2. One of these phase tuners can be a thermal phase tuner using a metal heater or a silicon heater for coarse channel spacing adjustment. The other phase tuner can be a p-i-n current injection tuner for fast lasing mode locking. In this case, the shared phase tuner is optional.

Figure 5:
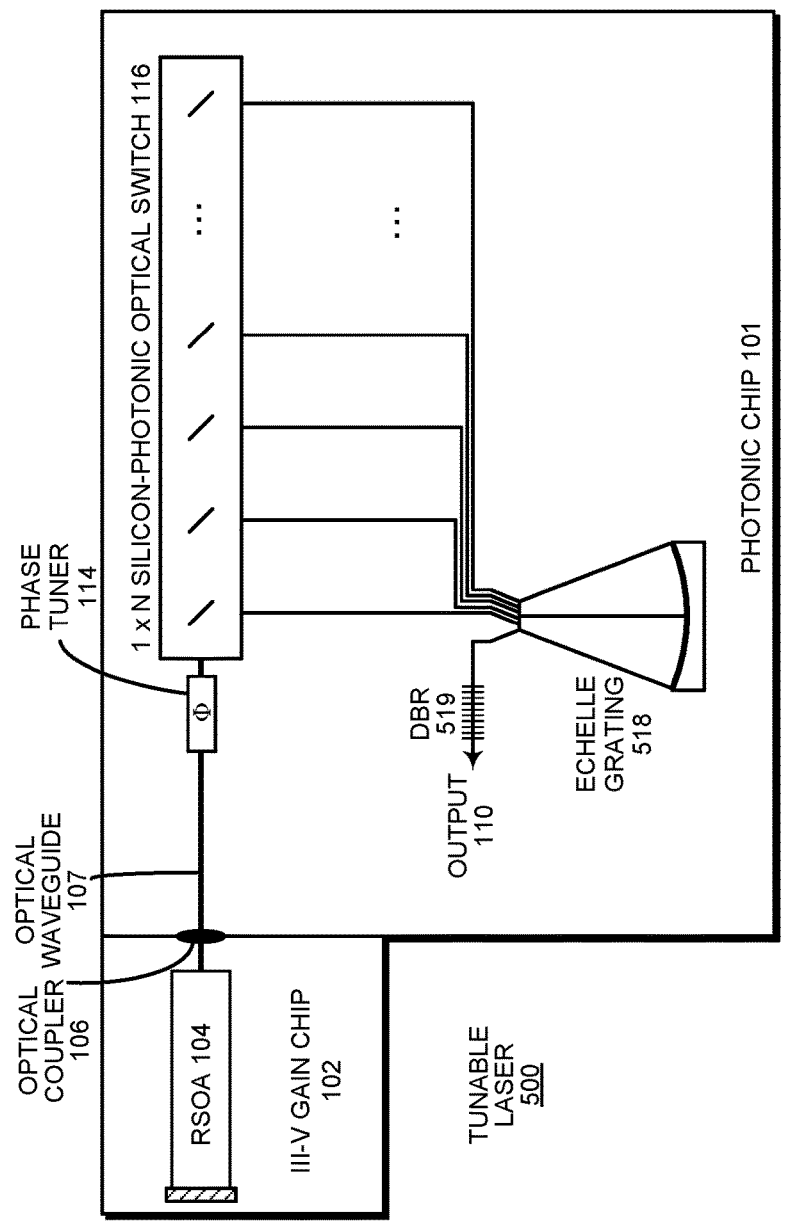
FIG. 5 illustrates a tunable laser implemented using an Echelle grating in accordance with the disclosed embodiments.
Figure 6:
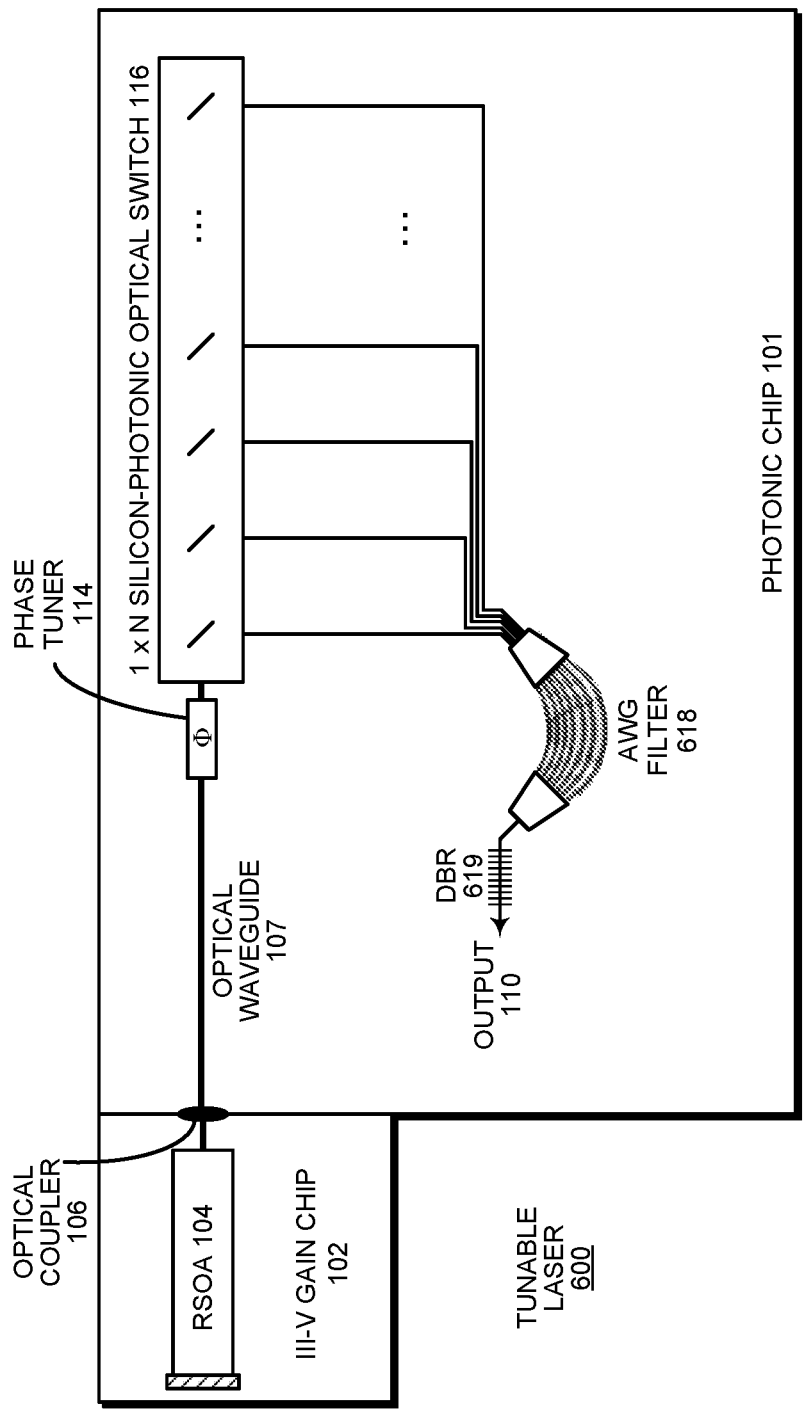
FIG. 6 illustrates a tunable laser implemented using an AWG-based wavelength filter in accordance with the disclosed embodiments.

Due to manufacturing tolerances, the channel spacing of the array of narrow-band reflectors 118 may not be as uniform as designed when individual wavelength filters are used. Wavelength tuning is typically needed for those filters to achieve the desired lasing wavelength. On the other hand, Echelle grating or arrayed waveguide grating (AWG) can provide an array of wavelength filters with accurate channel spacing. For example, FIG. 5 illustrates a tunable laser 500 that uses an Echelle grating 518 as a wavelength filter. For this configuration, a waveguide DBR 519 is used at the multiplexed output of Echelle grating 518 to provide partial reflections to the laser cavity and a laser output 110 simultaneously. Similarly, FIG. 6 illustrates a tunable laser 600 that uses an AWG filter 618 as a wavelength filter, and also uses waveguide DBR 619 at the multiplexed output of AWG filter 618 to provide partial reflections to the lasing cavity and a laser output 110 simultaneously.

Operation of the Tunable Laser

Figure 7:
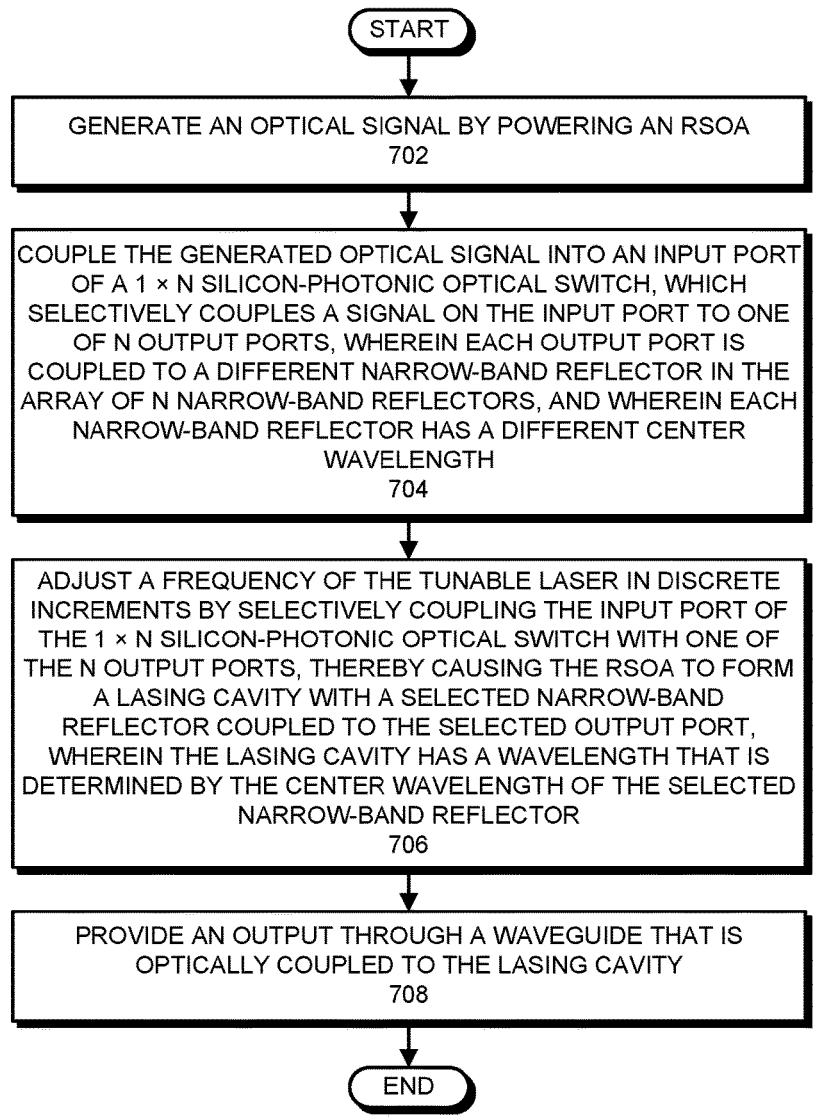
FIG. 7 presents a flow chart illustrating how a tunable laser operates in accordance with an embodiment of the present disclosure.

FIG. 7 presents a flow chart illustrating how a system that comprises a tunable laser operates in accordance with an embodiment of the present disclosure. First, the system generates an optical signal by powering an RSOA (step 702). Next, the system couples the generated optical signal into an input port of a 1×N silicon-photonic optical switch, which selectively couples the signal to one of N output ports, wherein each output port is coupled to a different narrow-band reflector in the array of N narrow-band reflectors, and wherein each narrow-band reflector has a different center wavelength (step 704). The system then adjusts a frequency of the tunable laser in discrete increments by selectively coupling the input port of the 1×N silicon-photonic optical switch to one of the N output ports, thereby causing the RSOA to form a lasing cavity with a selected narrow-band reflector coupled to the selected output port, wherein the lasing cavity has a wavelength that is determined by the center wavelength of the selected narrow-band reflector (step 706). Finally, the system provides an output through a waveguide that is optically coupled to the lasing cavity (step 708).

Providing Scalability and Redundancy

Figure 8:
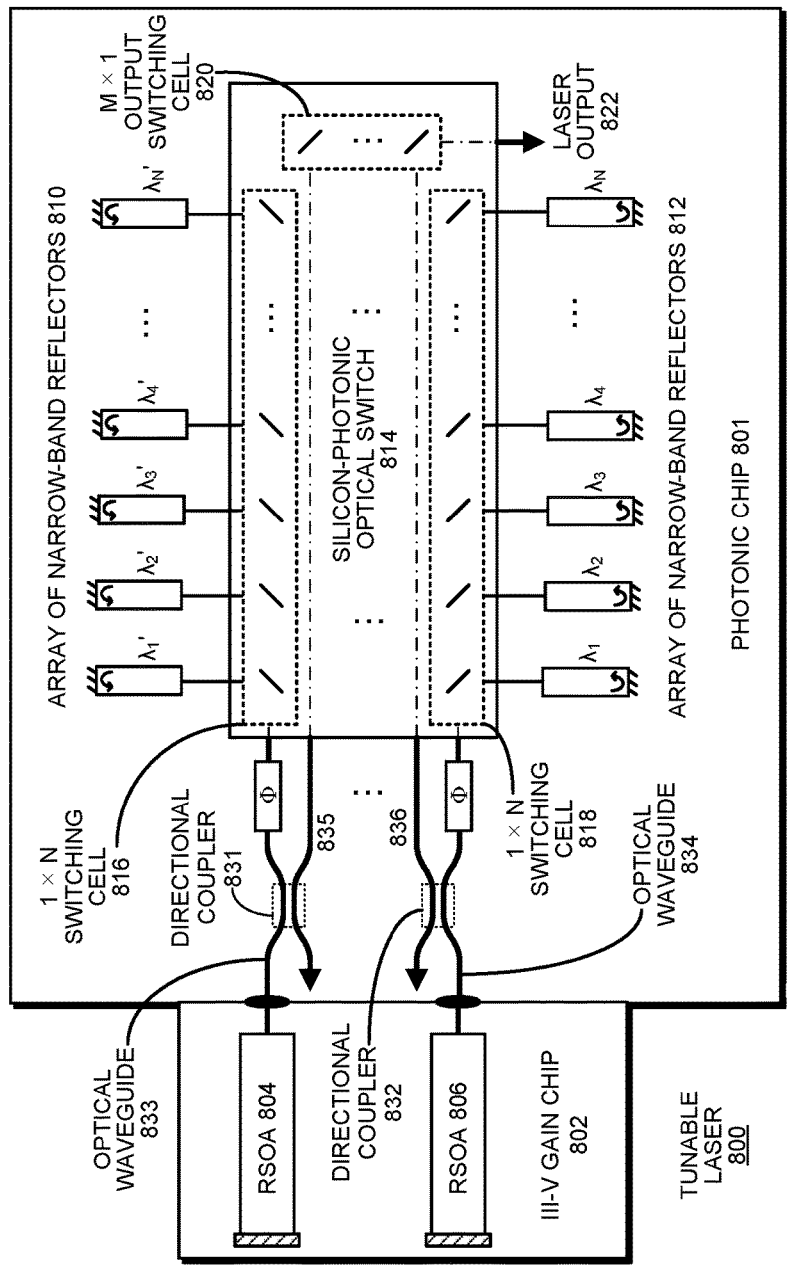
FIG. 8 illustrates a tunable laser that couples multiple gain media with multiple banks of narrow-band reflectors in accordance with the disclosed embodiments.

Because of practical limitations of the gain bandwidth of a single-channel gain medium, and/or the optical bandwidth of the wavelength filter devices, the number of wavelength channels of the above-described hybrid tunable laser is limited. Moreover, there is a reliability mismatch between the III-V gain medium and the SOI silicon-photonic circuits. To overcome these issues, it is desirable to develop a hybrid laser source that provides additional scalability and redundancy to facilitate high-performance optical interconnects and networking systems. To this end, a fast tunable III-V/Si hybrid laser can be expanded to provide more wavelength channels by using a larger MEMS matrix silicon-photonic switch. (Examples of such larger MEMS silicon switches are described in both [Seok2016A] and [Seok2016B] cited above.) For example, FIG. 8 illustrates how multiple RSOAs 804 and 806 can be incorporated into a tunable laser 800, which includes a silicon-photonic optical switch 814 that comprises multiple 1×N switching cells 816 and 818, which are coupled to RSOAs 804 and 806, respectively. More specifically, 1×N switching cell 816 couples RSOA 804 to an array of narrow-band reflectors 810, which covers set of wavelengths $\lambda_1', \lambda_2', \lambda_3', \lambda_4', \ldots \lambda_{N'}$, and 1×N switching cell 818 couples RSOA 806 to an array of narrow-band reflectors 812, which covers a set of wavelengths $\lambda_1, \lambda_2, \lambda_3, \lambda_4, \ldots, \lambda_{N}$. In some embodiments, RSOA 804 and RSOA 806 have different gain peaks, and the N narrow-band reflectors, which are associated with each RSOA, span a wavelength band centered around the gain peak of the RSOA. In other embodiments, RSOA 804 and RSOA 806 are identical, and the associated arrays of narrow-band reflectors 810 and 812 are also identical, thereby providing redundancy.

Tunable laser 800 also includes two directional couplers 831 and 832, wherein directional coupler 831 is integrated into an optical waveguide 833 that connects RSOA 804 with 1×N switching cell 816, and directional coupler 832 is integrated into an optical waveguide 834 that connects RSOA 806 with 1×N switching cell 818. Directional couplers 831 and 832 produce outputs 835 and 836, respectively, which feed into an M×1 output switching cell 820 that selects one of the outputs 835 or 836 to be the laser output 822. Note that additional laser cells can be added to tunable laser 800 in the same manner, with their outputs connected to the other input ports of M×1 output switching cell 820 to provide M×N wavelength channels.

Figure 9:
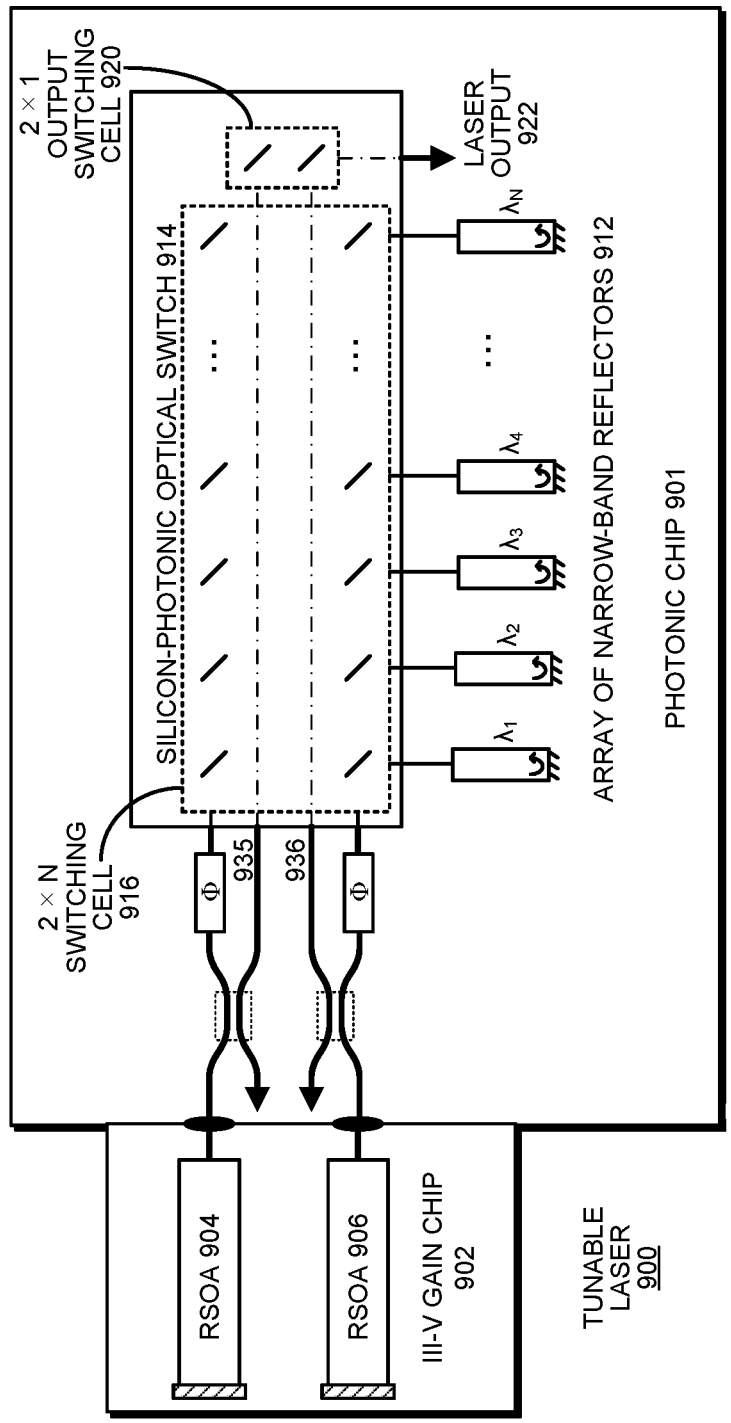
FIG. 9 illustrates a tunable laser that provides redundancy by coupling two gain media with a single bank of narrow-band reflectors in accordance with the disclosed embodiments.

In another embodiment, a fast tunable III-V/Si hybrid laser with redundancy can be implemented using a single set of narrow-band reflectors that provides a synthetic wavelength comb spectra. As illustrated in FIG. 9, two identical RSOAs 904 and 906 and a shared array of narrow-band reflectors 912 are connected to a 2×N switching cell 916 of a silicon-photonic optical switch 914. Note that the output ports 935 and 936 of the two laser channels are connected to input ports of a 2×1 output switching cell 920, which is located outside of the laser cavities. The output port of 2×1 output switching cell 920 provides a laser output 922.

Figure 10:
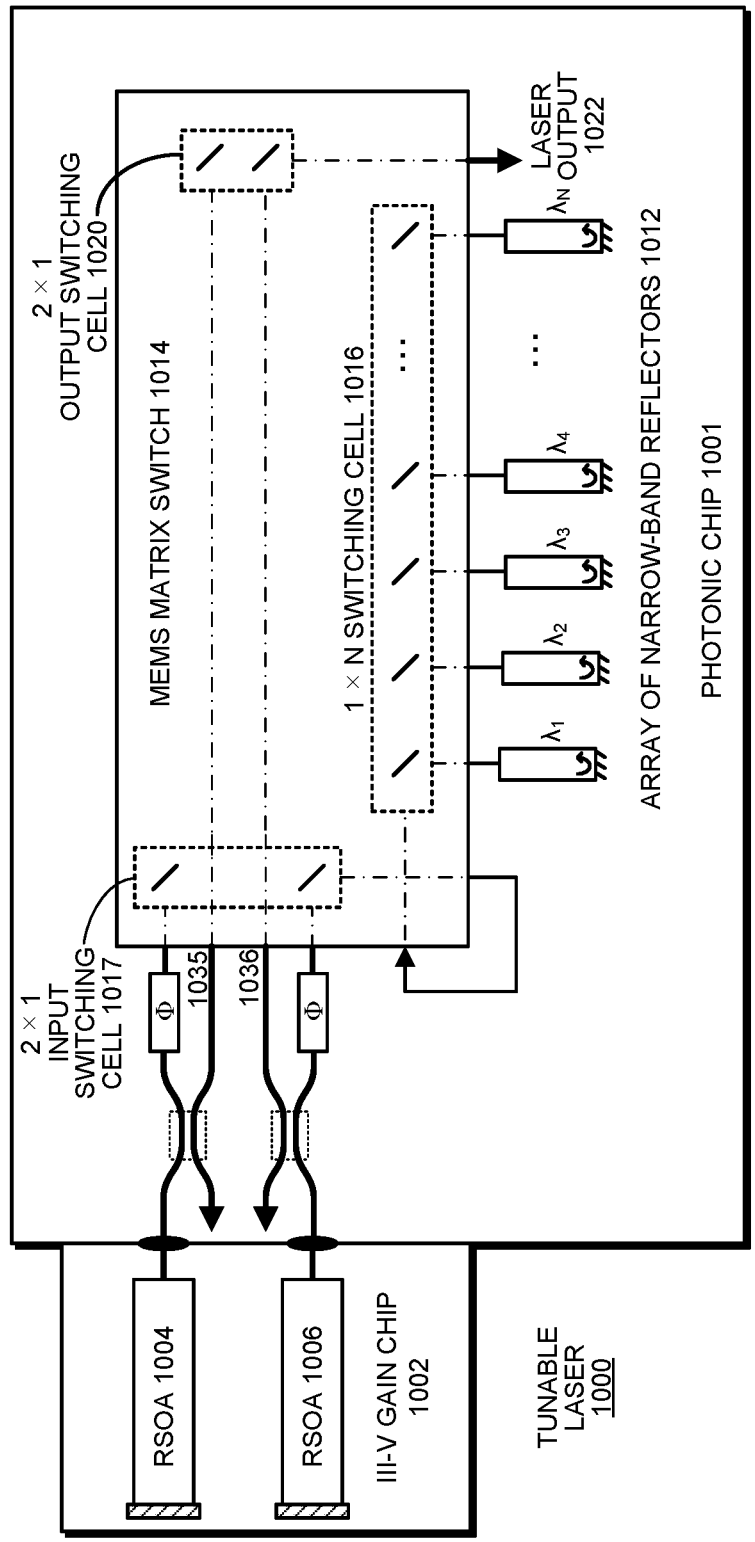
FIG. 10 illustrates another tunable laser that provides redundancy by coupling two gain media with a single bank of narrow-band reflectors in accordance with the disclosed embodiments.

In yet another embodiment, a fast tunable III-V/Si hybrid laser with redundancy can be realized using fewer switching elements. As illustrated in FIG. 10, two identical RSOAs 1004 and 1006 are connected to a 2×1 input switching cell 1017. The output of 2×1 input switching cell 1017 is looped back into an input of a single 1×N switching cell 1016, which has its output ports connected to a shared narrow array of narrow-band reflectors 1012. Similarly, the laser output ports 1035 and 1036 of the two channels are connected to the input ports of a 2×1 output switching cell 1020, which is located outside of the laser cavities. Finally, the output port of the 2×1 output switching cell 1020 provides a laser output 1022.

Operation of the Tunable Laser with Multiple Laser Channels

Figure 11:
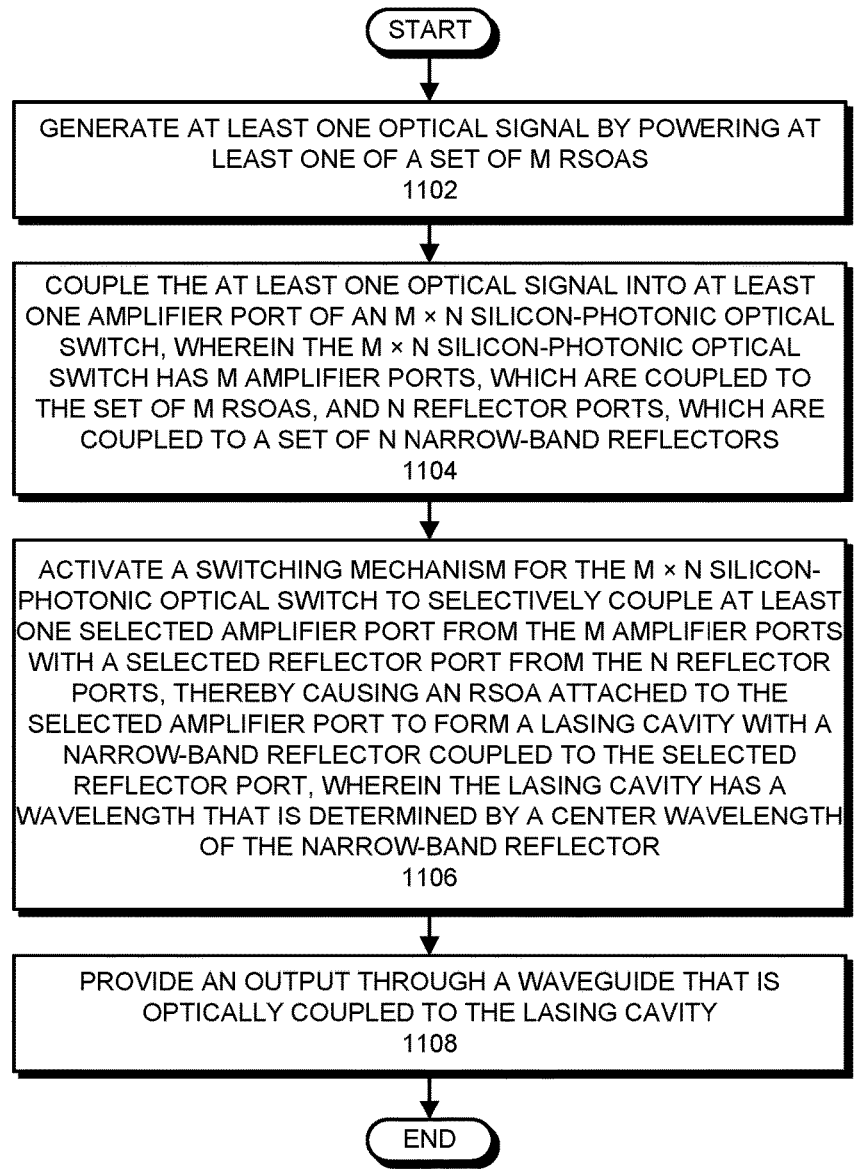
FIG. 11 presents a flow chart illustrating how a tunable laser with multiple laser channels operates in accordance with an embodiment of the present disclosure.

FIG. 11 presents a flow chart illustrating how a tunable laser with multiple laser channels operates in accordance with an embodiment of the present disclosure. During operation, the system generates at least one optical signal by powering at least one of a set of M RSOAs (step 1102). Next, the system couples the at least one optical signal into at least one amplifier port of an M×N silicon-photonic optical switch, wherein the M×N silicon-photonic optical switch has M amplifier ports, which are coupled to the set of M RSOAs, and N reflector ports, which are coupled to a set of N narrow-band reflectors (step 1104). The system then activates a switching mechanism for the M×N silicon-photonic optical switch to selectively couple at least one selected amplifier port from the M amplifier ports with a selected reflector port from the N reflector ports, thereby causing an RSOA coupled to the selected amplifier port to form a lasing cavity with a narrow-band reflector coupled to the selected reflector port, wherein the lasing cavity has a wavelength that is determined by a center wavelength of the narrow-band reflector (step 1106). Finally, the system provides an output through a waveguide that is optically coupled to the lasing cavity (step 1108).

System

Figure 12:
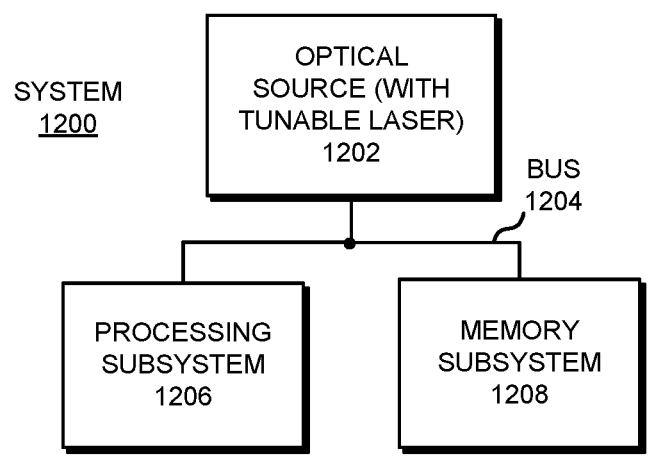
FIG. 12 illustrates a system that includes an optical source, such as a tunable laser, in accordance with an embodiment of the present disclosure.

One or more of the preceding embodiments of the tunable laser may be included in a system or device. More specifically, FIG. 12 illustrates a system 1200 that includes an optical source 1202 implemented using a tunable laser. System 1200 also includes a processing subsystem 1206 (with one or more processors) and a memory subsystem 1208 (with memory).

In general, components within optical source 1202 and system 1200 may be implemented using a combination of hardware and/or software. Thus, system 1200 may include one or more program modules or sets of instructions stored in a memory subsystem 1208 (such as DRAM or another type of volatile or non-volatile computer-readable memory), which, during operation, may be executed by processing subsystem 1206. Furthermore, instructions in the various modules in memory subsystem 1208 may be implemented in: a high-level procedural language, an object-oriented programming language, and/or in an assembly or machine language. Note that the programming language may be compiled or interpreted, e.g., configurable or configured, to be executed by the processing subsystem.

Components in system 1200 may be coupled by signal lines, links or buses, for example bus 1204. These connections may include electrical, optical, or electro-optical communication of signals and/or data. Furthermore, in the preceding embodiments, some components are shown directly connected to one another, while others are shown connected via intermediate components. In each instance, the method of interconnection, or "coupling," establishes some desired communication between two or more circuit nodes, or terminals. Such coupling may often be accomplished using a number of photonic or circuit configurations, as will be understood by those of skill in the art; for example, photonic coupling, AC coupling and/or DC coupling may be used.

In some embodiments, functionality in these circuits, components and devices may be implemented in one or more: application-specific integrated circuits (ASICs), field-programmable gate arrays (FPGAs), and/or one or more digital signal processors (DSPs). Furthermore, functionality in the preceding embodiments may be implemented more in hardware and less in software, or less in hardware and more in software, as is known in the art. In general, system 1200 may be at one location or may be distributed over multiple, geographically dispersed locations.

System 1200 may include: a switch, a hub, a bridge, a router, a communication system (such as a wavelength-division-multiplexing communication system), a storage area network, a data center, a network (such as a local area network), and/or a computer system (such as a multiple-core processor computer system). Furthermore, the computer system may include, but is not limited to: a server (such as a multi-socket, multi-rack server), a laptop computer, a communication device or system, a personal computer, a work station, a mainframe computer, a blade, an enterprise computer, a data center, a tablet computer, a supercomputer, a network-attached-storage (NAS) system, a storage-area-network (SAN) system, a media player (such as an MP3 player), an appliance, a subnotebook/netbook, a tablet computer, a smartphone, a cellular telephone, a network appliance, a set-top box, a personal digital assistant (PDA), a toy, a controller, a digital signal processor, a game console, a device controller, a computational engine within an appliance, a consumer-electronic device, a portable computing device or a portable electronic device, a personal organizer, and/or another electronic device.

Moreover, optical source 1202 can be used in a wide variety of applications, such as: communications (for example, in a transceiver, an optical interconnect or an optical link, such as for intra-chip or inter-chip communication), a radio-frequency filter, a bio-sensor, data storage (such as an optical-storage device or system), medicine (such as a diagnostic technique or surgery), a barcode scanner, metrology (such as precision measurements of distance), manufacturing (cutting or welding), a lithographic process, data storage (such as an optical-storage device or system) and/or entertainment (a laser light show).

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A tunable laser, comprising:
a set of M reflective silicon optical amplifiers (RSOAs);
a set of M optical waveguides coupled to the set of M RSOAs;
a set of N narrow-band reflectors, wherein each narrow-band reflector has a center wavelength;
a silicon-photonic optical switch, having M amplifier ports, which are coupled through the set of M optical waveguides to the set of M RSOAs, and N reflector ports, which are coupled to the set of N narrow-band reflectors;
a switching mechanism that facilitates coupling at least one selected amplifier port from the M amplifier ports with a selected reflector port from the N reflector ports, thereby causing an RSOA coupled to the selected amplifier port to form a lasing cavity with a narrow-band reflector coupled to the selected reflector port, wherein the lasing cavity has a wavelength that is determined by a center wavelength of the narrow-band reflector; and
a laser output optically coupled to the lasing cavity.

2. The tunable laser of claim 1,
wherein the set of N narrow-band reflectors is a subset of a larger set of M×N narrow-band reflectors, wherein the larger set of M×N narrow-band reflectors is divided into M subsets that each contain N narrow-band reflectors;
wherein the silicon-photonic optical switch includes M 1×N switching cells and an M×1 output switching cell;
wherein each of the M 1×N switching cells attaches a given RSOA in the set of M RSOAs with an associated subset of N narrow-band reflectors, whereby the given RSOA can be selectively coupled to a selected narrow-band reflector in the associated subset of N narrow-band reflectors to form a lasing cavity; and
wherein the tunable laser further comprises M directional couplers, which are integrated into the set of M optical waveguides to produce M outputs that feed into the M×1 output switching cell, which selects one of the M outputs to be the laser output.

3. The tunable laser of claim 2,
wherein each of the M RSOAs has a different gain peak; and
wherein the subset of N narrow-band reflectors, each of which is associated with the M RSOAs, spans a wavelength band centered around a gain peak for the RSOA.

4. The tunable laser of claim 2, wherein each of the M RSOAs is identical, and each of the M subsets of N narrow-band reflectors is identical, thereby providing redundancy.

5. The tunable laser of claim 1,
wherein the silicon-photonic optical switch includes an M×N switching cell and an M×1 output switching cell;
wherein the M×N switching cell facilitates coupling a selected RSOA from the set of M RSOAs with a selected narrow-band reflector from the set of N narrow-band reflectors to form a lasing cavity; and
wherein the tunable laser further comprises M directional couplers, which are integrated into the set of M optical waveguides to produce M outputs that feed into the M×1 output switching cell, which selects one of the M outputs to be the laser output.

6. The tunable laser of claim 1,
wherein the silicon-photonic optical switch includes an M×1 input switching cell, a 1×N switching cell and an M×1 output switching cell;
wherein the M×1 input switching cell selectively couples a selected RSOA in the set of M RSOAs with the 1×N switching cell;
wherein the 1×N switching cell selectively couples the selected RSOA with a selected reflector in the set of N narrow-band reflectors to form a lasing cavity; and
wherein the tunable laser further comprises M directional couplers, which are integrated into the set of M optical waveguides to produce M outputs that feed into the M×1 output switching cell, which selects one of the M outputs to be the laser output.

7. The tunable laser of claim 1, wherein the set of N narrow-band reflectors is implemented using one of the following:
a set of N distributed Bragg reflectors (DBRs);
a set of N ring-resonator-based filters, wherein each ring-resonator-based filter in the set has a specific radius to achieve a specific center wavelength;
an arrayed waveguide grating (AWG), wherein a waveguide DBR is coupled to a multiplexed output of the AWG to provide partial reflections to the lasing cavity and to simultaneously provide the laser output; and
an Echelle grating, wherein a waveguide DBR is coupled to a multiplexed output of the Echelle grating to provide partial reflections to the lasing cavity and to simultaneously provide the laser output.

8. The tunable laser of claim 1, wherein the set of M RSOAs is located on a III-V gain chip, which is separate from a silicon-on-insulator (SOI) chip that includes the silicon-photonic optical switch and other components of the tunable laser.

9. The tunable laser of claim 8, wherein the set of M RSOAs on the M-V gain chip are optically coupled to the set of M optical waveguides on the SOI chip through one of the following:
waveguide-to-waveguide edge coupling;
surface-normal coupling; and
evanescent coupling.

10. The tunable laser of claim 1, further comprising a set of M phase tuners, wherein each optical waveguide in the set of M optical waveguides feeds through a phase modulator in the set of M phase tuners before coupling to one of the M amplifier ports of the silicon-photonic optical switch, wherein the set of M phase tuners facilitates adjusting at least one frequency for the tunable laser.

11. The tunable laser of claim 1, wherein there exists a predetermined channel spacing between center wavelengths for the N narrow-band reflectors in the set of N narrow-band reflectors.

12. A system, comprising:
at least one processor;
at least one memory coupled to the at least one processor; and
a tunable laser for communicating optical signals generated by the system, wherein the tunable laser includes:
a set of M reflective silicon optical amplifiers (RSOAs);
a set of M optical waveguides coupled to the set of M RSOAs;
a set of N narrow-band reflectors, wherein each narrow-band reflector has a center wavelength;
a silicon-photonic optical switch, having M amplifier ports, which are coupled through the set of M optical waveguides to the set of M RSOAs, and N reflector ports, which are coupled to the set of N narrow-band reflectors;
a switching mechanism that facilitates coupling at least one selected amplifier port from the M amplifier ports with a selected reflector port from the N reflector ports, thereby causing an RSOA coupled to the selected amplifier port to form a lasing cavity with a narrow-band reflector coupled to the selected reflector port, wherein the lasing cavity has a wavelength that is determined by a center wavelength of the narrow-band reflector; and
a laser output optically coupled to the lasing cavity.

13. The system of claim 12,
wherein the set of N narrow-band reflectors is a subset of a larger set of M×N narrow-band reflectors, wherein the larger set of M×N narrow-band reflectors is divided into M subsets that each contain N narrow-band reflectors;
wherein the silicon-photonic optical switch includes M 1×N switching cells and an M×1 output switching cell;
wherein each of the M 1×N switching cells attaches a given RSOA in the set of M RSOAs with an associated subset of N narrow-band reflectors, whereby the given RSOA can be selectively coupled to a selected narrow-band reflector in the associated subset of N narrow-band reflectors to form a lasing cavity; and
wherein the tunable laser further comprises M directional couplers, which are integrated into the set of M optical waveguides to produce M outputs that feed into the M×1 output switching cell, which selects one of the M outputs to be the laser output.

14. The system of claim 13,
wherein each of the M RSOAs has a different gain peak; and
wherein the subset of N narrow-band reflectors, each of which is associated with the M RSOAs, spans a wavelength band centered around a gain peak for the RSOA.

15. The system of claim 13, wherein each of the M RSOAs is identical, and each of the M subsets of N narrow-band reflectors is identical, thereby providing redundancy.

16. The system of claim 12,
wherein the silicon-photonic optical switch includes an M×N switching cell and an M×1 output switching cell;
wherein the M×N switching cell facilitates coupling a selected RSOA from the set of M RSOAs with a selected narrow-band reflector from the set of N narrow-band reflectors to form a lasing cavity; and
wherein the tunable laser further comprises M directional couplers, which are integrated into the set of M optical waveguides to produce M outputs that feed into the M×1 output switching cell, which selects one of the M outputs to be the laser output.

17. The system of claim 12,
wherein the silicon-photonic optical switch includes an M×1 input switching cell, a 1×N switching cell and an M×1 output switching cell;
wherein the M×1 input switching cell selectively couples a selected RSOA in the set of M RSOAs with the 1×N switching cell;
wherein the 1×N switching cell selectively couples the selected RSOA with a selected reflector in the set of N narrow-band reflectors to form a lasing cavity; and
wherein the tunable laser further comprises M directional couplers, which are integrated into the set of M optical waveguides to produce M outputs that feed into the M×1 output switching cell, which selects one of the M outputs to be the laser output.

18. The system of claim 12, wherein the set of N narrow-band reflectors is implemented using one of the following:
   a set of N distributed Bragg reflectors (DBRs);
   a set of N ring-resonator-based filters, wherein each ring-resonator-based filter in the set has a specific radius to achieve a specific center wavelength;
   an arrayed waveguide grating (AWG), wherein a waveguide DBR is coupled to a multiplexed output of the AWG to provide partial reflections to the lasing cavity and to simultaneously provide the laser output; and
   an Echelle grating, wherein a waveguide DBR is coupled to a multiplexed output of the Echelle grating to provide partial reflections to the lasing cavity and to simultaneously provide the laser output.

19. The system of claim 12, wherein the set of M RSOAs is located on a III-V gain chip, which is separate from a silicon-on-insulator (SOI) chip that includes the silicon-photonic optical switch and other components of the tunable laser.

20. A method for operating a tunable laser, comprising:
   generating a least one optical signal by powering at least one of a set of M reflective silicon optical amplifiers (RSOAs);
   coupling the at least one optical signal into at least one amplifier port of an M×N silicon-photonic optical switch, wherein the M×N silicon-photonic optical switch has M amplifier ports, which are coupled to the set of M RSOAs, and N reflector ports, which are coupled to a set of N narrow-band reflectors;
   activating a switching mechanism for the M×N silicon-photonic optical switch to selectively couple at least one selected amplifier port from the M amplifier ports with a selected reflector port from the N reflector ports, thereby causing an RSOA coupled to the selected amplifier port to form a lasing cavity with a narrow-band reflector coupled to the selected reflector port, wherein the lasing cavity has a wavelength that is determined by a center wavelength of the narrow-band reflector; and
   providing an output through a waveguide that is optically coupled to the lasing cavity.

* * * * *

UNITED STATES PATENT AND TRADEMARK OFFICE
CERTIFICATE OF CORRECTION

PATENT NO. : 9,768,587 B1
APPLICATION NO. : 15/341691
DATED : September 19, 2017
INVENTOR(S) : Zheng et al.

It is certified that error appears in the above-identified patent and that said Letters Patent is hereby corrected as shown below:

In the Specification

In Column 4, Line 59, delete "MN" and insert -- III-V --, therefor.

In the Claims

In Column 14, Line 2, in Claim 20, delete "a least" and insert -- at least --, therefor.

Signed and Sealed this
Twenty-second Day of May, 2018

Andrei Iancu
*Director of the United States Patent and Trademark Office*